United States Patent
Ali et al.

(10) Patent No.: US 6,448,983 B1
(45) Date of Patent: Sep. 10, 2002

(54) METHOD FOR SELECTION OF A DESIGN OF EXPERIMENT

(75) Inventors: Mohamed Ahmed Ali, Niskayuna; Ahmed Flasser, Latham; Arlie Russell Martin, Ballston Spa, all of NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/231,437

(22) Filed: Jan. 14, 1999

(51) Int. Cl.[7] .............................. G09G 5/00; G06F 7/00; G06F 17/30; G06F 15/00
(52) U.S. Cl. ...................... 345/780; 345/888; 345/809; 707/10; 712/2
(58) Field of Search .............................. 345/742, 808, 345/780, 809, 825; 707/10; 712/2

(56) References Cited

U.S. PATENT DOCUMENTS

| | | | | |
|---|---|---|---|---|
| 5,623,592 A | * | 4/1997 | Carlson et al. ............. | 345/866 |
| 5,652,909 A | * | 7/1997 | Kodosky .................... | 717/125 |
| 5,821,932 A | * | 10/1998 | Pittore et al. ................ | 345/809 |
| 5,825,356 A | * | 10/1998 | Habib et al. ................. | 345/712 |
| 5,953,731 A | * | 9/1999 | Glaser ......................... | 707/513 |
| 5,956,736 A | * | 9/1999 | Hanson et al. .............. | 707/513 |
| 5,986,670 A | * | 11/1999 | Dries et al. .................. | 345/629 |
| 6,083,693 A | * | 7/2000 | Nandabalan et al. ....... | 435/69.1 |
| 6,141,657 A | * | 10/2000 | Rothberg et al. ............ | 707/20 |
| 6,192,354 B1 | * | 2/2001 | Bigus et al. .................. | 706/46 |
| 6,336,052 B1 | * | 1/2002 | Ouellet et al. ................ | 700/83 |

* cited by examiner

*Primary Examiner*—Kristine Kincaid
*Assistant Examiner*—Thomas J Joseph
(74) *Attorney, Agent, or Firm*—George C. Goodman; Donald Ingraham

(57) ABSTRACT

A method for assisting a user in selecting a design of experiment. The method includes obtaining a plurality of attributes associated with a plurality of experimental designs. A series of questions is presented to the user directed to objectives of the design of experiment. The user responds to the questions and one or more user-selected attributes are determined in response to the user's answers to the questions. The process selects or de-selects one or more of the experimental designs in response to the user-selected attributes and notifies the user of the selected experimental designs.

18 Claims, 9 Drawing Sheets

```
Design Type: Central Composite
Number of Factors: 5
Number of Runs: 27

Data (Select the data and use Control-C to copy to the clipboard):
-1.0       -1.0       -1.0       -1.0       1.0
1.0        -1.0       -1.0       -1.0       -1.0
-1.0       1.0        -1.0       -1.0       -1.0
1.0        1.0        -1.0       -1.0       1.0
-1.0       -1.0       1.0        -1.0       -1.0
1.0        -1.0       1.0        -1.0       1.0
-1.0       1.0        1.0        -1.0       1.0
1.0        1.0        1.0        -1.0       -1.0
-1.0       -1.0       -1.0       1.0        -1.0
1.0        -1.0       -1.0       1.0        1.0
-1.0       1.0        -1.0       1.0        1.0
1.0        1.0        -1.0       1.0        -1.0
-1.0       -1.0       1.0        1.0        1.0
1.0        -1.0       1.0        1.0        -1.0
-1.0       1.0        1.0        1.0        -1.0
1.0        1.0        1.0        1.0        1.0
2.2361     0.0        0.0        0.0        0.0
0.0        2.2361     0.0        0.0        0.0
0.0        0.0        2.2361     0.0        0.0
0.0        0.0        0.0        2.2361     0.0
0.0        0.0        0.0        0.0        2.2361
-2.2361    0.0        0.0        0.0        0.0
0.0        -2.2361    0.0        0.0        0.0
0.0        0.0        -2.2361    0.0        0.0
0.0        0.0        0.0        -2.2361    0.0
0.0        0.0        0.0        0.0        -2.2361
0.0        0.0        0.0        0.0        0.0
```

Fig. 5

METHOD FOR SELECTION OF A DESIGN OF EXPERIMENT

BACKGROUND OF THE INVENTION

The invention relates to a method for selection of an experimental design. Design of Experiments (DOE) is a statistical based approach for efficient cause and effect analysis of a system. The process of designed experimentation entails sampling an n-dimensional design or process operating space. By perturbing the inputs (or X's) in an orderly fashion, insight into the effect on the outputs (or Y's) may be gained.

There exists a number of various families of experimental designs such as Box-Behnken, Plackett-Burman, Central Composite (face-centered or not), Small Central Composite (face-centered or not), Taguchi and Orthogonal designs, Optimal designs (with different optimality criteria), Mixture, Factorial and Fractional Factorial, and Hybrid. Depending upon the objective of the given experiment, the selection of an appropriate DOE will prove to be critical in order to obtain the desired results from the experiment. If the wrong DOE is selected, this can lead to inaccurate results. The DOE tool is being used increasingly by users with little or no experience in selecting an appropriate DOE. Accordingly, a method of selecting an appropriate DOE would be beneficial to such users.

BRIEF SUMMARY OF THE INVENTION

An exemplary embodiment of the invention is directed to a method for assisting a user in selecting a design of experiment. The method includes obtaining a plurality of attributes associated with a plurality of experimental designs. A series of questions are presented to the user directed to objectives of the design of experiment. The user responds to the questions and one or more user-selected attributes are determined in response to the user's answers to the questions. The process selects or de-selects one or more of the experimental designs in response to the user-selected attributes and notifies the user of the selected experimental designs.

BRIEF DESCRIPTION OF THE DRAWINGS

Referring now to the drawings wherein like elements are numbered alike in the several Figures:

FIG. 5 depicts an exemplary output design of experiment.

DETAILED DESCRIPTION OF THE INVENTION

An exemplary embodiment of the invention is a method for selecting a DOE. Depending upon the objective of the given experiment, the selection of an appropriate DOE will prove to be critical in order to obtain the desired results from the experiment. The following are examples of various potential objectives with respect to designed experiments:

1—Screening a large number of parameters for the vital few;

2—Obtaining Main and/or Interaction effects;

3—Transfer Function generation and modeling of a smaller set of parameters;

4—Optimization.

Independent of the desired experimental objective, the user may have constraints due to the nature of the system under examination. Cost and/or time of experimentation may be an issue and would therefore dictate an alternate approach to the design selection as well as the execution of the experiment. Each DOE is particularly suitable for certain situations and negative consequences (unnecessary increase in cost and/or decrease in accuracy) may result from utilizing an inappropriate DOE.

In order to facilitate selection of an appropriate DOE, an exemplary embodiment of the invention provides a DOE selection. As described herein, the process provides the user with a series of questions which lead through a decision tree to identify the appropriate DOE. The process features:

1—Easily understood questions relating to the user's objectives.

2—Predefined answers in the form of options.

3—Certain decisions based on the answers selected by the users.

4—Help associated with the question (if needed).

The experimental designs are stored in a database and associated with technical attributes. As the user traverses the decision tree, the potential DOE options are selected and/or deselected based upon the association of the technical attributes with user-selected attributes derived from the answers provided. Examples of technical attributes associated with the experimental design selection process are as follows:

1—DOE Family Type

2—Number of Parameters

3—Number of Levels

4—Number of Experimental Runs Required

5—Resolution

6—Fractionation

7—Anticipated Optima Position

8—Fit Desired

9—Extrapolation

Figure 1:
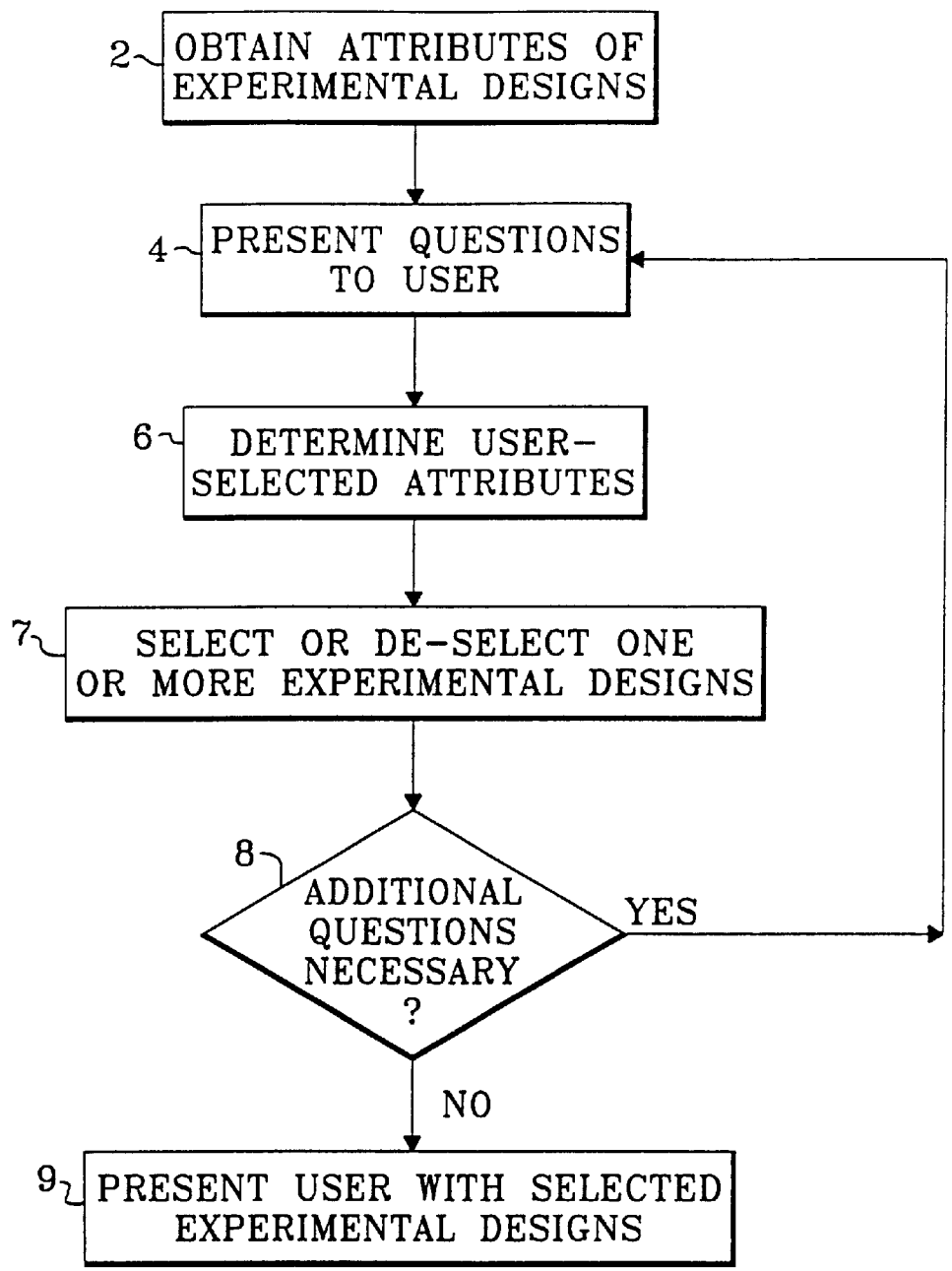
FIG. 1 is a flowchart of a process for selection of a design of experiment.

FIG. 1 is a flowchart depicting an overall process for selecting a suitable experimental design. At step 2, attributes of various experimental designs are obtained. A list of experimental designs may be stored in memory along with the attributes associated with each experimental design. At step 4, questions are presented to the user in order to determine user-selected attributes. The questions are designed to determine suitable attributes for the user's objectives. Exemplary questions are presented below in FIGS. 2 and 3. Based on the user's responses to the posed questions, user-selected attributes are determined at step 6. At step 7, one or more experimental designs are selected or de-selected based on the user-selected attributes. An experimental design is selected if its attributes correspond to the user-selected attributes. Conversely, an experimental design is de-selected if its attributes are contrary to the user-selected attributes. At step 8, the process determines if there are additional questions. If so, flow returns to step 4 and if not, flow proceeds to step 9, where the user is presented with the selected experimental designs.

Figure 2A:
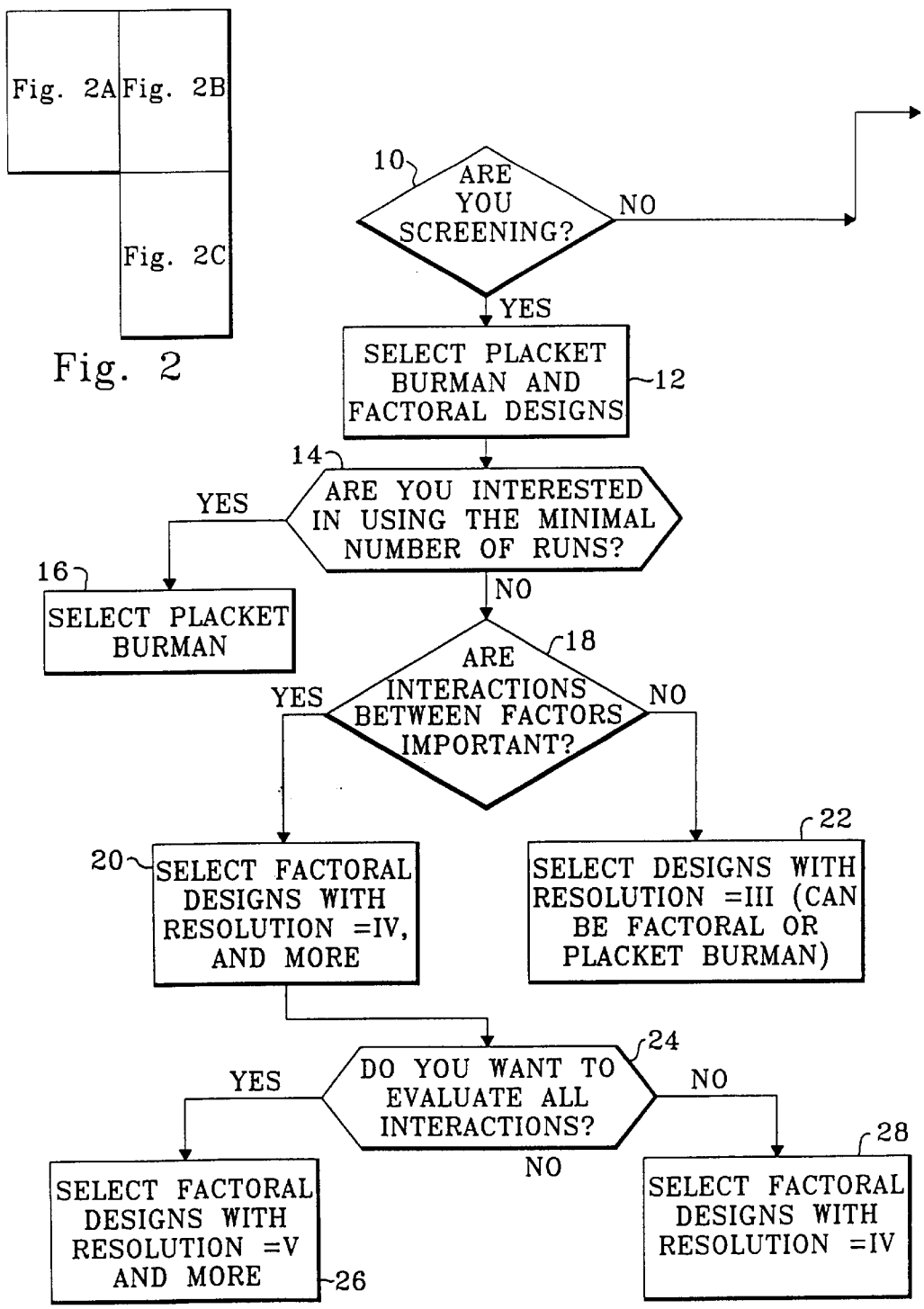
FIG. 2 is a flowchart of a decisional process for selection of a design of experiment.
Figure 2B:
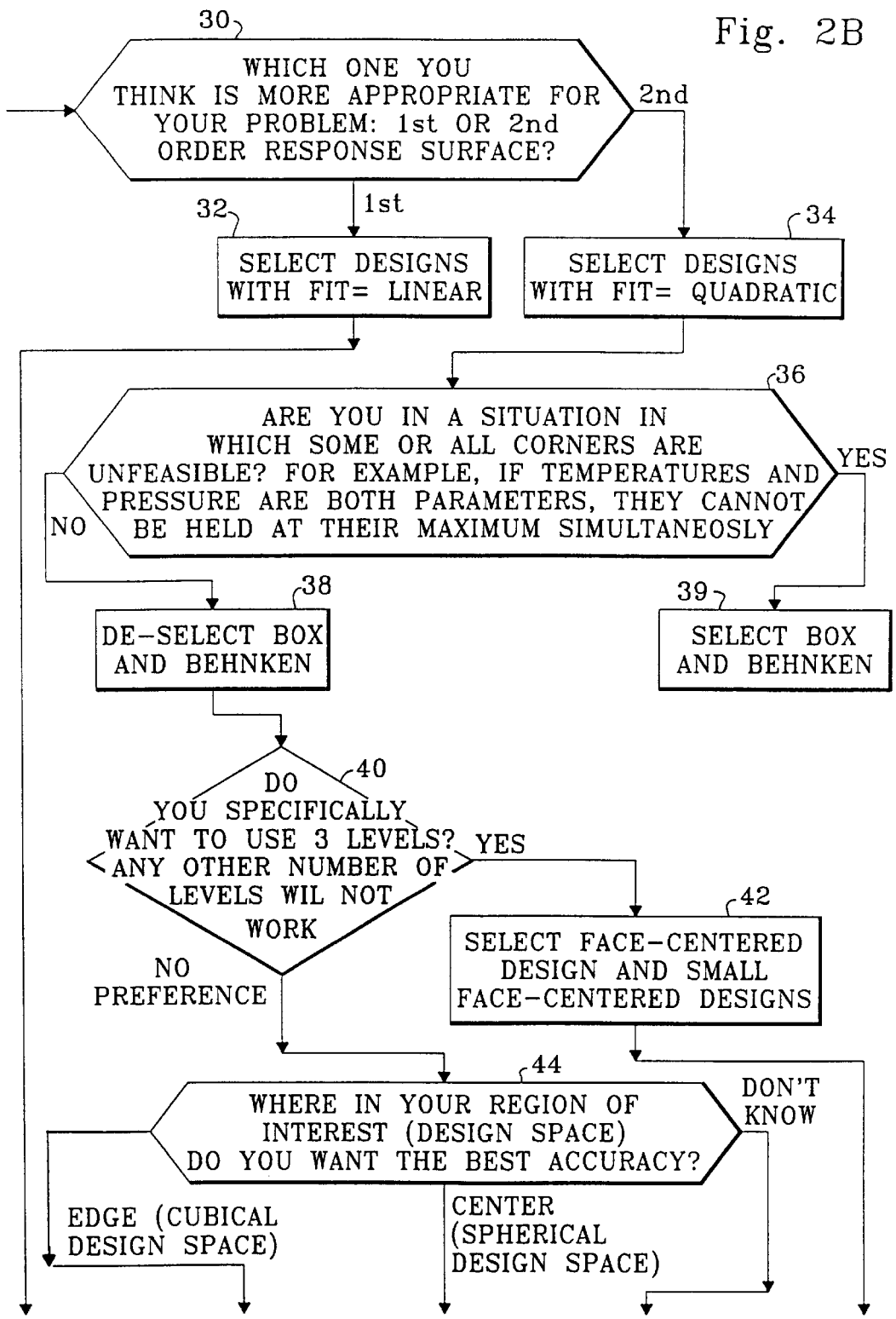
Figure 2C:
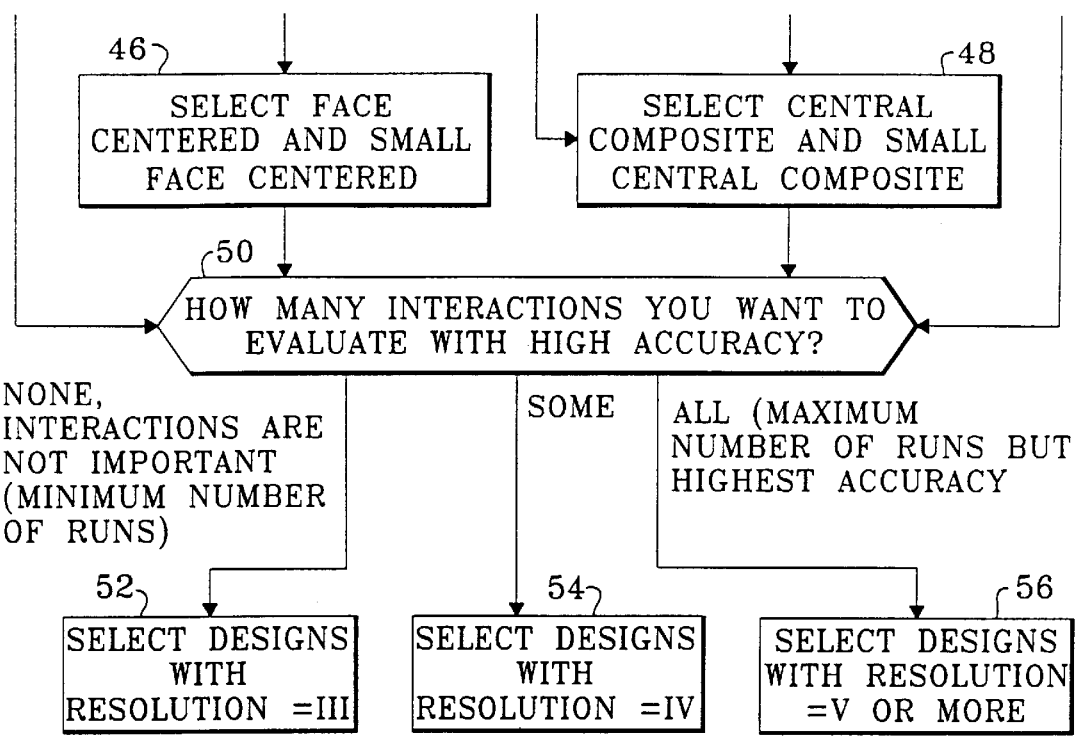

FIG. 2 depicts a flowchart of the process of selecting a DOE in an exemplary embodiment of the invention. The user is guided through the decisional process shown in FIG.

Figure 4:
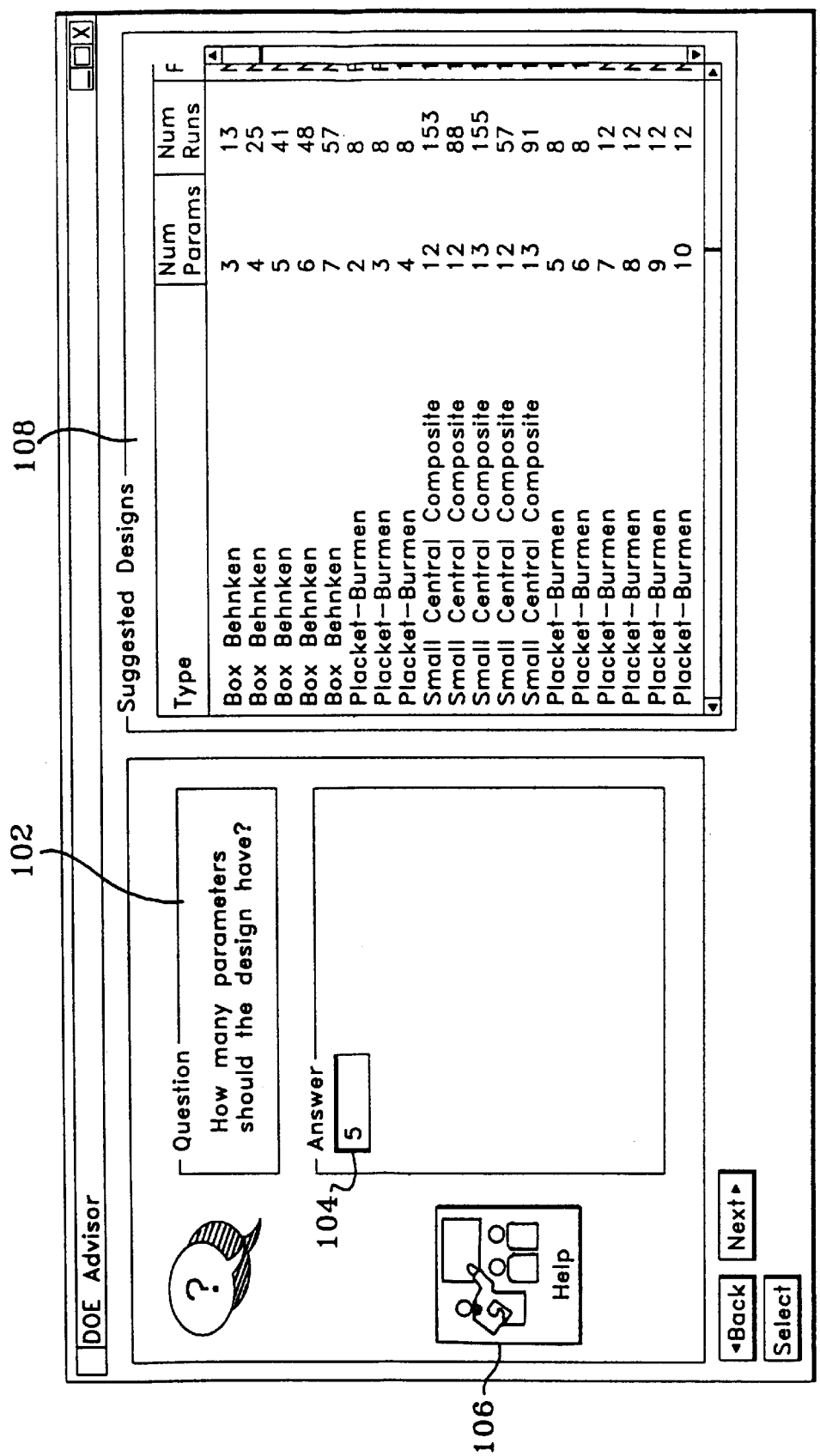
FIG. 4 depicts a user interface for implementing a process for selection of a design of experiment.

2 through a user interface such as that shown in FIG. 4. FIG. 4 depicts a graphical user interface in which the user is presented questions in question area 102. The user can enter answers in answer area 104 and obtain help at any time by selecting Help icon 106. Suggested designs may be presented to the user in a design area 108.

Referring to FIG. 2, the process begins at step 10 where the user is asked whether they are screening. If the user needs help with this question, they can request a help prompt by selecting the Help icon 106 as shown in FIG. 4. Selecting help at step 10 presents a message to the user such as "Select Yes if you are at a preliminary stage aimed at exploring the important parameters. This often happens if you have many parameters, you don't want to be working with all of them, and think that there might be a chance to pick some of the parameters as the key parameters." If the user responds Yes at step 10, the process selects the Placket-Burman and Factorial designs as acceptable DOE's at step 12 and flow proceeds to step 14.

At step 14 the user is asked whether they are interested in using the minimal number of runs. If the user needs help with this question, the user can select the Help icon 106 as shown in FIG. 4 and receive a message such as "You may select Yes if the number of runs of this screening stage is an issue. It must be kept in mind that reducing the number of runs has effects on accuracy." If the user responds Yes at step 14, flow proceeds to step 16 where the Placket-Burman experimental design is selected and the process ends.

If the user responds No at step 14, flow proceeds to step 18 where the user is asked whether interactions between the factors are important. Factors are the parameters the user is interested in modeling. If the user selects help at step 18, the user receives a message such as "Are all or some interactions important? For example, if A, B, C are factors, is any of AB, AC, BC expected to be important? Answer yes if that is so." If the user responds Yes to step 18, flow proceeds to step 20 where the process selects Factorial designs with a resolution equal to four or more. If the user responds No at step 18, flow proceeds to step 22 where the process selects designs with a resolution equal to three or three* which can be either Factorial designs or Placket-Burman or Draper-Lin for the case of small Central Composite designs.

From step 20, flow proceeds to step 24 where the user is queried whether they want to evaluate all interactions. If user requests help at step 24, a message is presented to the user such as "Are all possible two-way interactions important? For example, if A, B, C are factors, are AB, AC, BC all expected to be important? Answer yes if this is so." Responding Yes at step 24 leads to step 26 where the process selects Factorial designs with a resolution equal to five or more. Responding No at step 24 leads to step 28 where the process selects Factorial designs with a resolution of four.

If at step 10, the user responds No indicating that the user is not screening, flow proceeds to step 30 where the user is queried to select between a first or second order response surface. Selecting help at step 30 presents a message to the user such as "First order approximation requires less number of runs, however, if your ranges are large or if the problem is known to have substantial non-linearities the second order approximation will provide more accurate results." If the user selects a first order response surface at step 30, flow proceeds to step 32 at which the process selects designs having a linear fit.

From step 32, flow proceeds to step 50 where the user is queried how many interactions they want to evaluate with high accuracy. At step 50, if the user selects help, a message is presented such as "Are all possible two-way interactions important? For example, if A, B, and C are factors, are AB, AC, and BC all expected to be important? Answer ALL if that is so. If no interaction is believed to be influential, answer NONE. This results in minimizing the number of runs. In case of doubt, answer SOME if the number of runs is an issue or if the number of runs does not represent a difficulty." If the user selects NONE at step 50, flow proceeds to step 52 where the process selects designs with a resolution of three. If the user selects SOME at step 50, the process selects designs with a resolution equal to four at step 54. If the user selects ALL at step 50, the process selects designs with resolution equal to five or more at step 56.

If at step 30, the user selects a second order response, the process proceeds to step 34 where designs having a quadratic fit are selected. Flow proceeds to step 36 where the user is questioned whether the user has a situation in which some or all corners are unfeasible. If the user requests help at step 36, a message will be presented to the user such as "In some cases, corners of the region of interest are physically meaningless or unfeasible. For example, the machine can fail if both temperature and pressure are held at their maximum level. Select Yes if you are in a similar situation." If the user selects No at step 36, flow proceeds to step 38 where the process de-selects the Box-Behnken designs. If the user selects Yes at step 36, flow proceeds to step 39 where the process selects the Box-Behnken design and the process ends.

From step 38, flow proceeds to step 40 where the user is questioned whether they specifically want to use three levels (i.e., any other number of levels will not work). If the user requests help at step 40, a message is presented to the user such as "In some situations you cannot use more than three levels. For example, factor A can only be low, medium and high." If the user selects Yes at step 40, flow proceeds to step 42 where the process selects Face Centered designs and Small Face Centered designs. From step 42, flow proceeds to step 50 where the user is asked how many interactions they want to evaluate with high accuracy as described above.

If at step 40, the user indicates no preference on the number of levels, flow proceeds to step 44 where the user is queried where in the region of interest (i.e., design space) do they want the best accuracy. Alternatively, the question could query the user about shape of design space. Selecting help at step 44 will present a message such as "Not all methods are accurate everywhere in the region of interest, some are better at the center, others are better at the corners or edges." If the user requests the best accuracy at an edge or selects a cubicle design space at step 44, flow proceeds to step 46 where the process selects Face Centered and Small Face Centered designs. From step 46, flow proceeds to step 50 where the user is queried how many interactions they want to evaluate with high accuracy as described above.

If at step 44, the user requests the best accuracy at a center, indicates a spherical design space, or responds Don't Know, flow proceeds to step 48 where the process selects Central Composite and Small Central Composite designs. From step 48, flow proceeds to step 50 where the user is queried how many interactions they want to evaluate with high accuracy as described above.

Figure 3A:
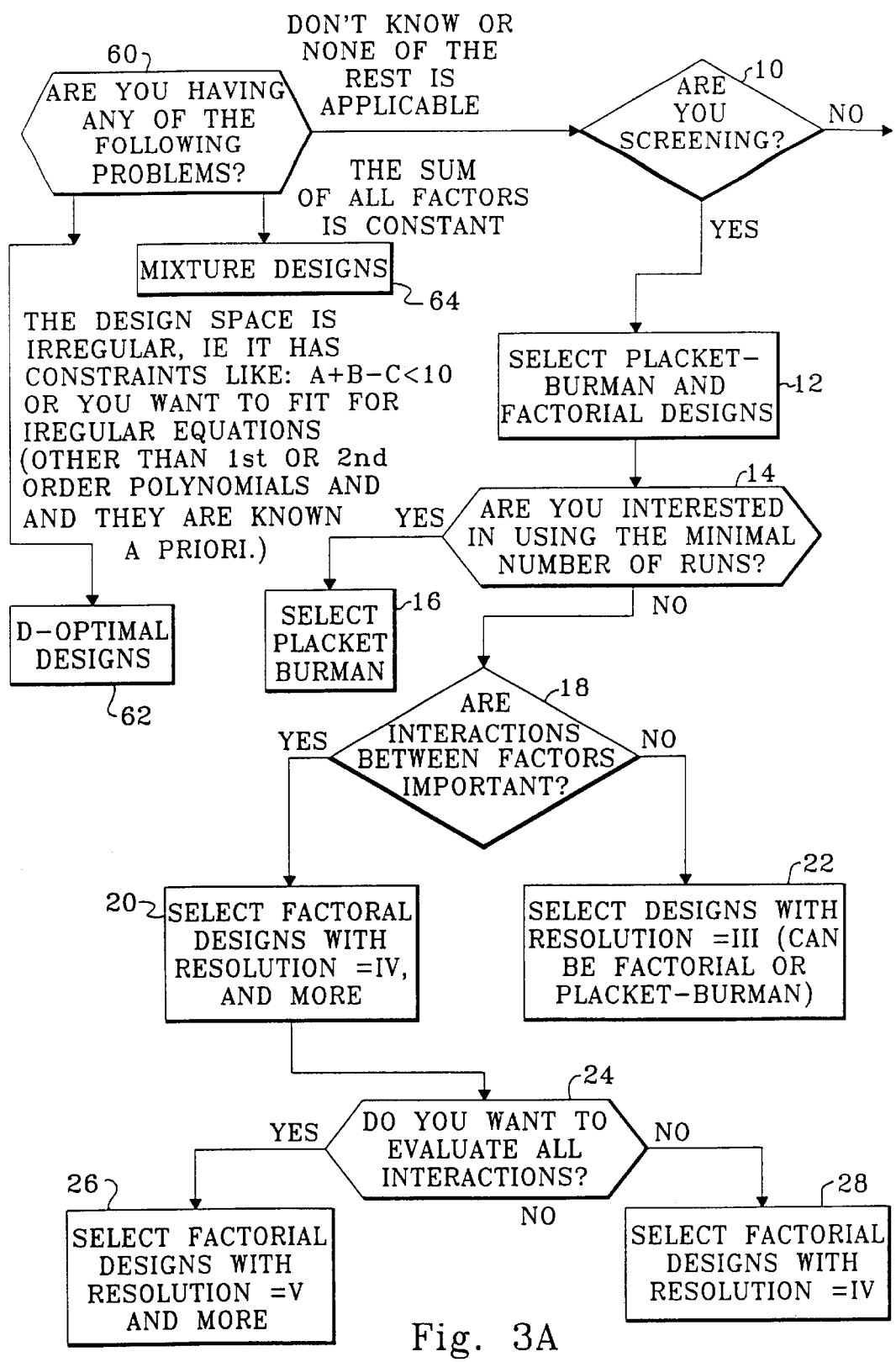
FIG. 3 is a flowchart of an alternative decisional process for selection of a design of experiment.
Figure 3B:
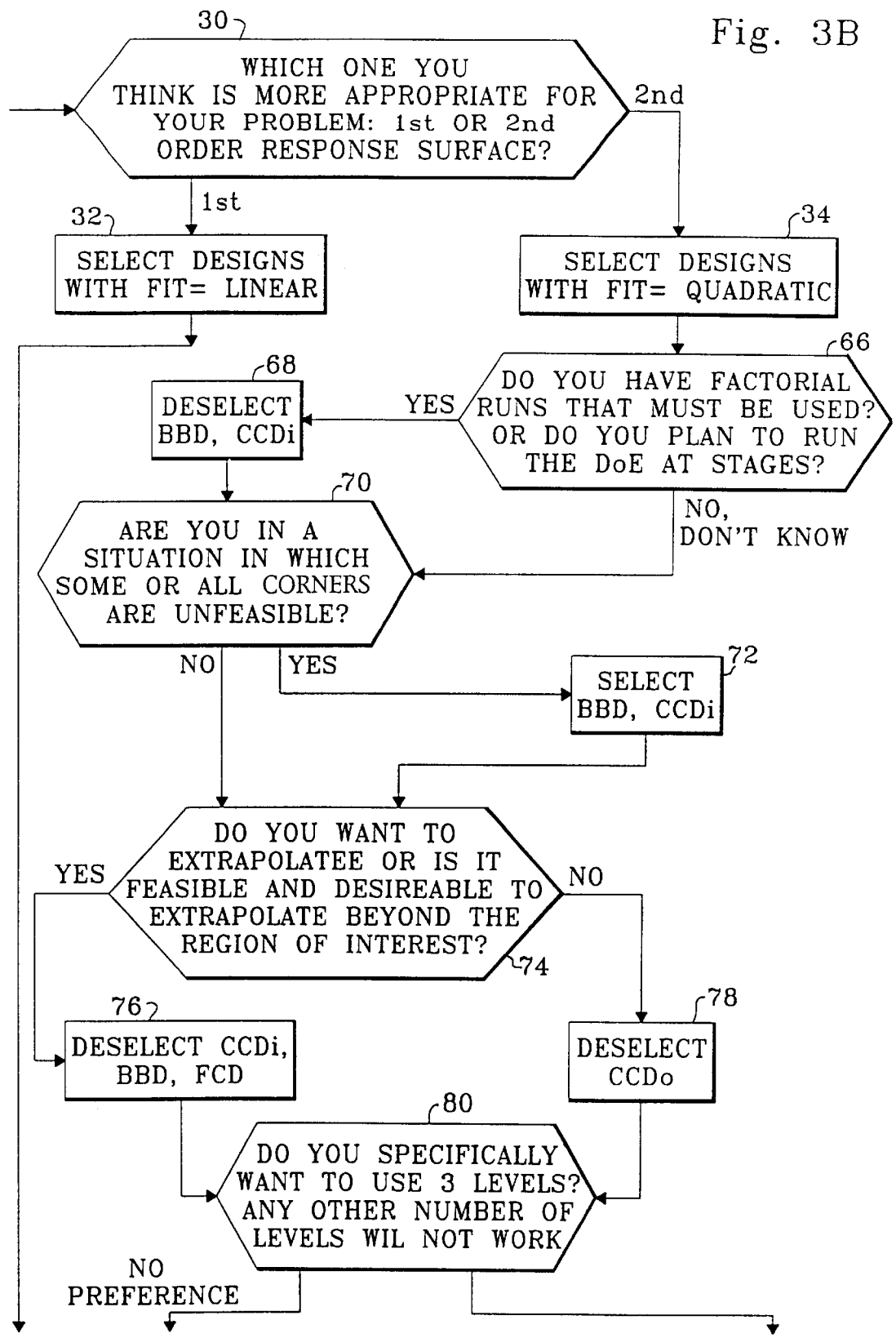
Figures 3, 3C:
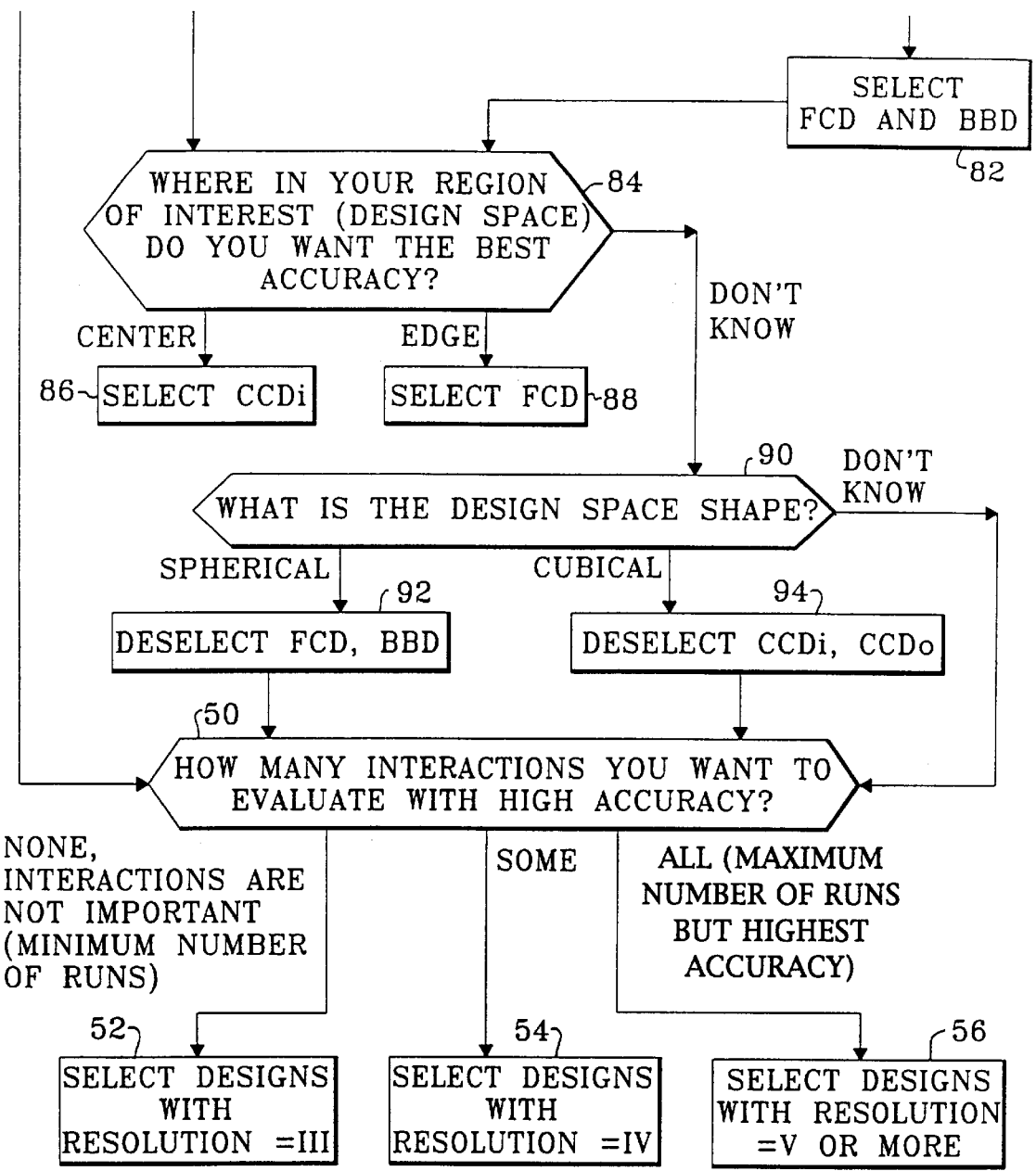

FIG. 3 depicts an alternative embodiment of the invention for use with slightly more sophisticated users. The process begins at step 60 where the user is questioned whether they are having particular problems. The first identified problem is that the design space is irregular. In other words, the design space has constraints such as A+B·C<10 or the user wants to fit for irregular equations other than first and second order polynomials that are known a priori. If the user indicates that this problem exists, flow proceeds to step 62 where the process selects D-optimal designs and ends. A second problem presented to the user at step 60 is whether the sum of all the factors is constant. If the user identifies this problem, flow proceeds to step 64 where the process selects Mixture designs and ends.

If at step 60, the user responds that they don't know or none of the problems are applicable, flow proceeds to step 10. Steps 10–34 and 50–56 in FIG. 2 are similar to steps 10–34 and 50–56 in FIG. 3 and description of these steps is not repeated. There is a difference in when question 50 is presented as described herein. From step 34, flow proceeds to step 66 where the user is queried whether they have factorial runs that must be used or do they plan to run the DOE at stages. If the user responds Yes at step 66, flow proceeds to step 68 where the process de-selects the Box-Behnken designs and the Central Composite designs. From step 68, or if the user answers No or Don't Know at step 66, flow proceeds to step 70 where the user is asked whether there are any situations in which some or all of the corners are unfeasible? Selecting help at step 70 will present a message such as "In some cases corners of the regions of interest are physically meaningless or unfeasible. For example, the machine can fail if both temperature and pressure are held at their maximum level. Select Yes if you are in a similar situation." If the user selects Yes at step 70, flow proceeds to step 72 where the process selects the Box-Behnken design and the Central Composite design.

From step 72 or if the user answers No in step 70, flow proceeds to step 74 where the user is questioned whether they want to extrapolate or is it feasible and desirable to extrapolate beyond the region of interest. If the user answers Yes to step 74, flow proceeds to step 76 where the process de-selects rotatable Central Composite designs (rotatable Central Composite designs being a particular case or generally, experimental designs with alpha greater than 1) with all points located inside the design space (designated by CCDi), the Box-Behnken designs and the Face Centered design. If the user answers No at step 74, flow proceeds to step 78 where the process de-selects the rotatable Central Composite designs (rotatable Central Composite designs being a particular case or generally, experimental designs with alpha greater than 1) with some points located outside the design space (designated by CCDo).

Steps 76 and 78 both proceed to step 80 where the user is questioned whether they want to use three levels (i.e., any other number of levels will not work). Selecting help at step 80 will present a message to the user such as "In some situations you cannot use more than three levels. For example, factor A can only be low, medium and high." If at step 80, the user indicates that they want to use three levels, flow proceeds to step 82 where the process selects the Face Centered designs and the Box-Behnken designs.

From step 82 or if the user indicates no preference in step 80, flow proceeds to step 84 where the user is queried where in the region of interest (e.g. design space) do they want the best accuracy. Selecting help at step 84 will present a message to the user such as "Not all methods are accurate everywhere in the region of interest, some are better at the center, others are better at corners or edges." If the user requests the best accuracy at a center at step 84, flow proceeds to step 86 where the process selects rotatable Central Composite designs (rotatable Central Composite designs being a particular case or generally, experimental designs with alpha greater than 1) having all points inside the design space (CCDi) and ends. If the user requests the best accuracy at an edge at step 84, flow proceeds to step 88 where the process selects the Face Centered designs and ends.

If the user answers Don't Know at step 84, flow proceeds to step 90 where the user is queried about the design space shape. Selecting help at step 90 will present a message to the user such as "Most design spaces are actually cubicle, so in case of doubt select cubicle if the answer to the previous question was also Don't Know." If the user selects spherical at step 90, flow proceeds to step 92 where the process de-selects the Face Centered designs and the Box-Behnken designs. If the user selects cubicle, flow proceeds to step 94 where the process de-selects the rotatable Central Composite designs (rotatable Central Composite designs being a particular case or generally, experimental designs with alpha greater than 1). Steps 92 and 94 or answering Don't Know to step 90 lead to step 50. In the embodiment shown in FIG. 3, the question at step 50 is only asked if CCDo, CCDi or Face Centered designs remain (i.e. have not been de-selected).

A Don't Know answer at step 84 may alternatively lead to selection of Central Composite designs including Face Centered designs. Central Composite designs are used quite frequently and users may be familiar with this type of design. Accordingly, if the user lacks knowledge about the nature of the design space, it may be appropriate to direct the user to a Central Composite design.

If the user answers the questions in such a manner that no experimental designs are selected, the process can select a default experimental design. For example, if no experimental designs are selected the process can default to D-optimal designs. The user may also be notified that their answers were contradictory and that the objectives of the design of experiment should be reviewed.

As described above, each of the experimental designs is associated with technical attributes. As the user answers questions in the decision process shown in FIGS. 2 or 3, one or more user-selected technical attributes are defined. Based on the user-selected technical attributes, certain experimental designs are selected or deselected (i.e., excluded) and the user is presented with the viable experimental designs. FIG. 5 depict a sample design of experiment output presented to the user for a Central Composite experimental design with 5 factors and 27 runs.

The invention has been described as a method and can be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method for assisting a user in selecting at least one experimental design comprising:

obtaining a plurality of attributes associated with a plurality of experimental designs;

presenting a series of questions to the user directed to objectives of said experimental designs;

determining one or more user-selected attributes in response to the user's answers to said questions;

selecting or deselecting at least one of said plurality of experimental designs in response to said user-selected attributes; and notifying the user of the selected at least one experimental design, wherein one of said questions is directed to whether the user is using a minimum number of runs.

2. The method for assisting a user of claim 1 wherein:

one of said questions is directed to whether the user is screening.

3. The method for assisting a user of claim 1 wherein:

said experimental designs include factors; and one of said questions is directed to interactions between factors.

4. The method for assisting a user of claim 3 wherein:

one of said questions is directed to the number of interactions between factors to be tracked.

5. The method for assisting a user of claim 1 wherein:

one of said questions is directed to selection of one of a first and second order response surface.

6. The method for assisting a user of claim 1 wherein:

one of said questions is directed to whether certain design conditions are unfeasible.

7. The method for assisting a user of claim 4 wherein:

one of said questions is directed to the number of levels assigned to one of the factors.

8. The method for assisting a user of claim 1 wherein:

one of said questions is directed to a shape of a design space.

9. The method for assisting a user of claim 1 wherein:

one of said questions is directed to a location in the design space having high accuracy.

10. A storage medium encoded with machine-readable computer program code for causing a computer to implement a method of:

obtaining a plurality of attributes associated with a plurality of experimental designs;

presenting a series of questions to the user directed to objectives of said experimental designs;

determining one or more user-selected attributes in response to the user's answers to said questions;

selecting or deselecting at least one of said plurality of experimental designs in response to said user-selected attributes; and notifying the user of the selected at least one experimental design, wherein one of said questions is directed to whether the user is using a minimum number of runs.

11. The storage medium of claim 10 wherein:

one of said questions is directed to whether the user is screening.

12. The storage medium of claim 10 wherein:

said experimental designs include factors; and one of said questions is directed to interactions between factors.

13. The storage medium of claim 12 wherein:

one of said questions is directed to the number of interactions between factors are to be tracked.

14. The storage medium of claim 10 wherein:

one of said questions is directed to selection of one of a first and second order response surface.

15. The storage medium of claim 10 wherein:

one of said questions is directed to whether certain design conditions are unfeasible.

16. The storage medium of claim 12 wherein:

one of said questions is directed to the number of levels assigned to one of the factors.

17. The storage medium of claim 10 wherein:

one of said questions is directed to a shape of a design space.

18. The storage medium of claim 10 wherein:

one of said questions is directed to a location in the design space having high accuracy.

* * * * *

UNITED STATES PATENT AND TRADEMARK OFFICE
CERTIFICATE OF CORRECTION

PATENT NO. : 6,448,983 B1
DATED : September 10, 2002
INVENTOR(S) : Mohamed Ahmed Ali et al.

It is certified that error appears in the above-identified patent and that said Letters Patent is hereby corrected as shown below:

<u>Title page,</u>
Item [75], Inventors, please delete "Ahmad Flasser" and insert -- Ahmed Elasser -- therefor.

Signed and Sealed this

Fourth Day of May, 2004

JON W. DUDAS
*Acting Director of the United States Patent and Trademark Office*